(12) United States Patent  
Hiller et al.

(10) Patent No.: US 7,649,138 B2  
(45) Date of Patent: Jan. 19, 2010

(54) THERMOELECTRIC DEVICE WITH SURFACE CONFORMING HEAT CONDUCTOR

(75) Inventors: Nathan David Hiller, Fallbrook, CA (US); John Claude Bass, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 628 days.

(21) Appl. No.: 11/177,011

(22) Filed: Jul. 7, 2005

(65) Prior Publication Data

US 2006/0266404 A1 Nov. 30, 2006

Related U.S. Application Data

(63) Continuation-in-part of application No. 11/138,741, filed on May 25, 2005.

(51) Int. Cl.
*H01L 35/30* (2006.01)
*H01L 35/00* (2006.01)

(52) U.S. Cl. ..................... 136/205; 136/200
(58) Field of Classification Search .......... 136/200–242
See application file for complete search history.

(56) References Cited

U.S. PATENT DOCUMENTS 4,937,435 A * 6/1990 Goss et al. ............... 219/528
5,351,748 A * 10/1994 Dagan ...................... 165/80.3
6,056,163 A * 5/2000 Lai .......................... 222/321.2
2004/0128041 A1* 7/2004 Hiller et al. ................ 701/40
2005/0139250 A1* 6/2005 DeSteese et al. ........... 136/212

* cited by examiner

*Primary Examiner*—Alexa D Neckel
*Assistant Examiner*—Shannon Gardner
(74) *Attorney, Agent, or Firm*—John R. Ross; John R. Ross, III

(57) ABSTRACT

A quickly attachable electric generator device for producing electric power from surfaces of hot or cold pipes. The invention provides a thermoelectric unit which includes a pedestal comprised of a material with high thermal conductivity on which a thermoelectric module is located. The pedestal includes a heat transfer element made to conform to a hot or cold cylindrical surface. The module also includes a module-to-air heat transfer element and the thermoelectric module is compressed between the air-to-module element and the pedestal. This element is referred to as a heat sink when energy is extracted from a hot surface and is referred to as a heat source when energy is flowing from the air and a cold surface. In preferred embodiments the heat transfer element is a thin flexible heat conductor that conforms to the hot or cold surface of various shapes and serves as a heat transfer conduit to transfer heat to or from a rigid portion of the pedestal. Electric energy is generated from the heat flowing through the module.

22 Claims, 16 Drawing Sheets

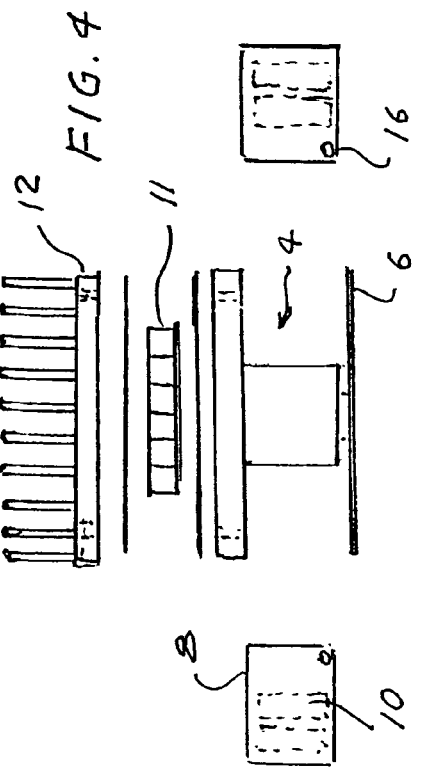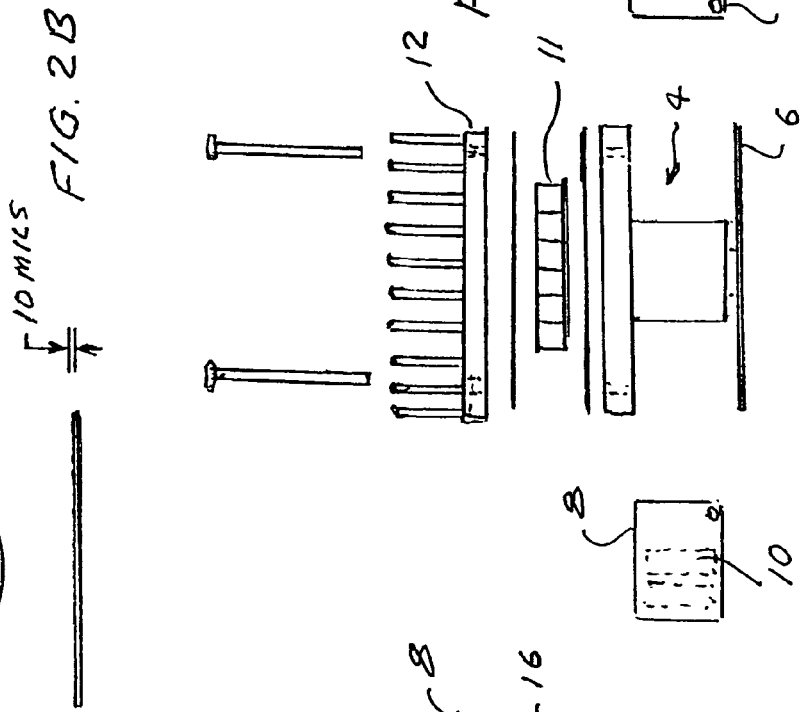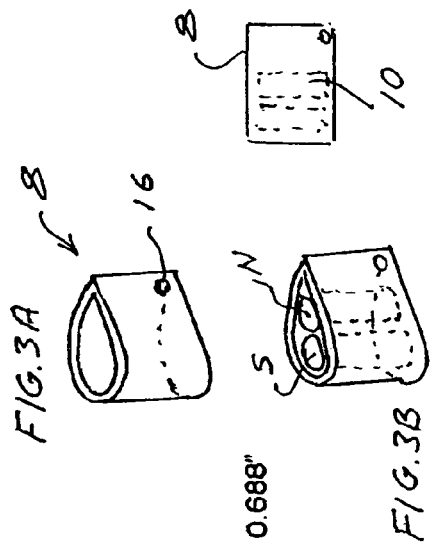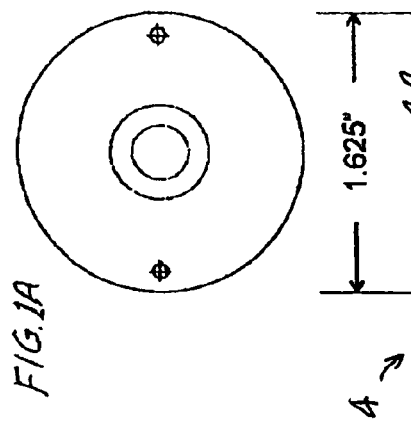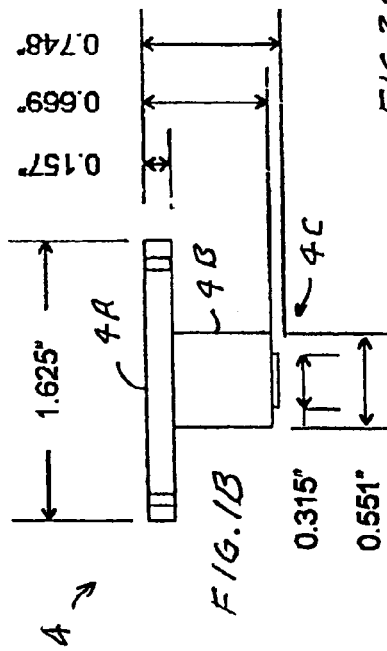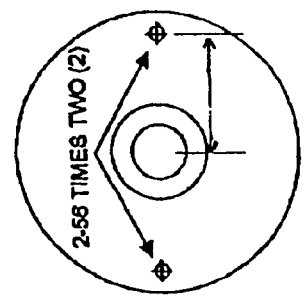

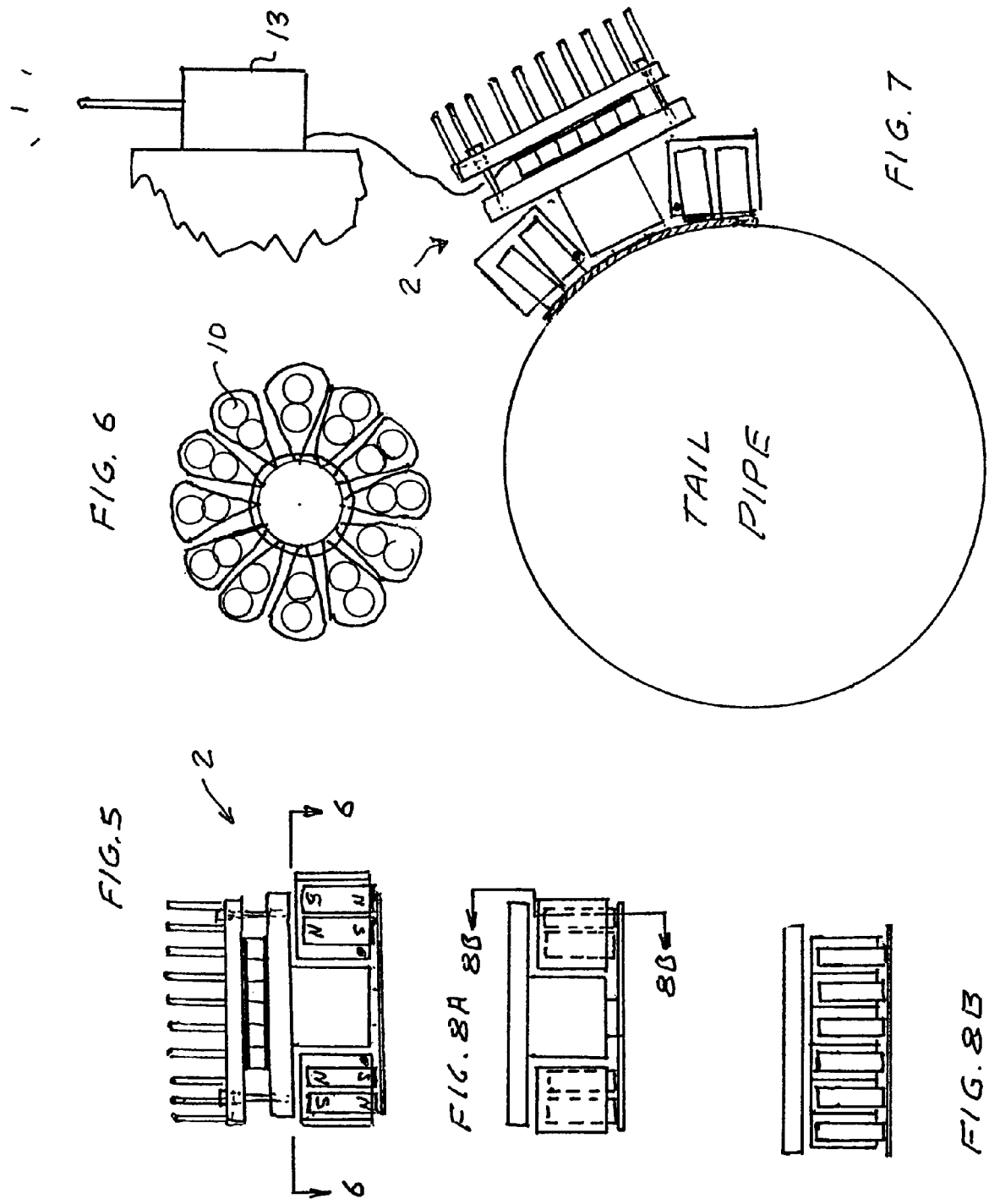

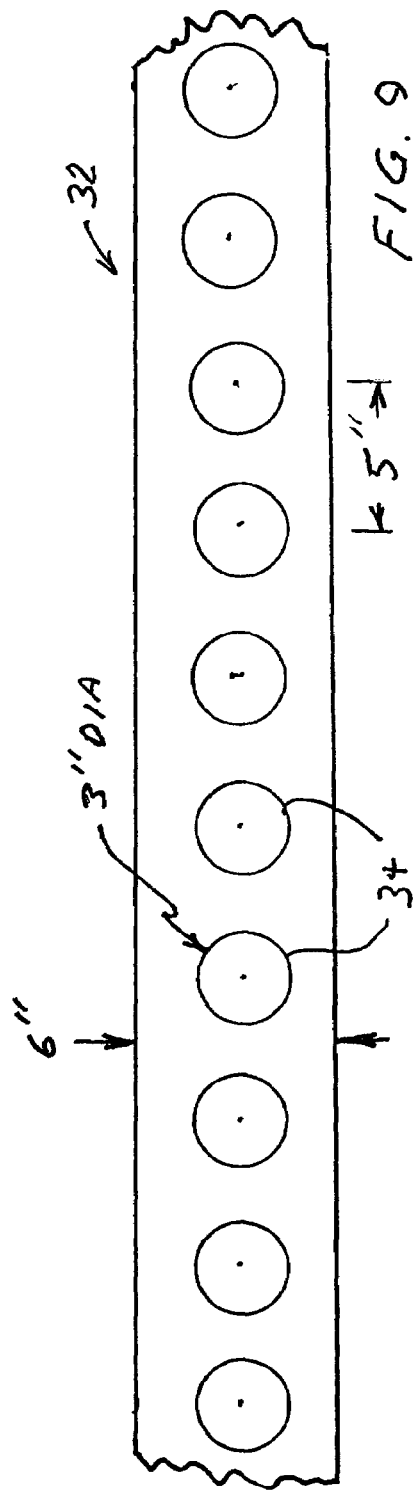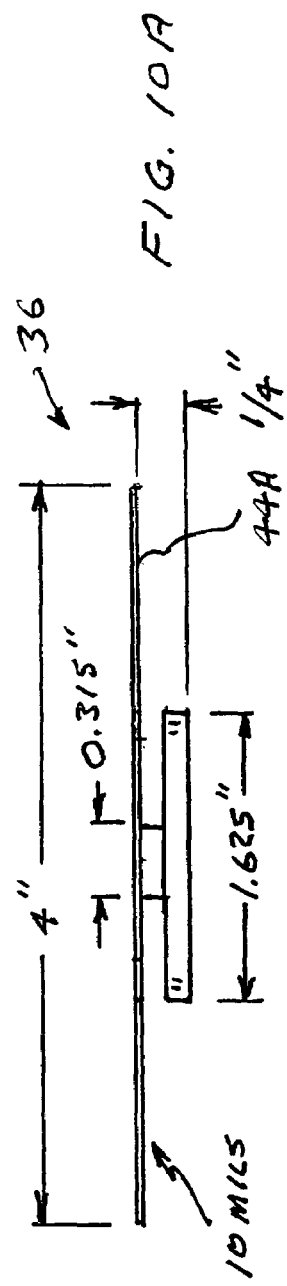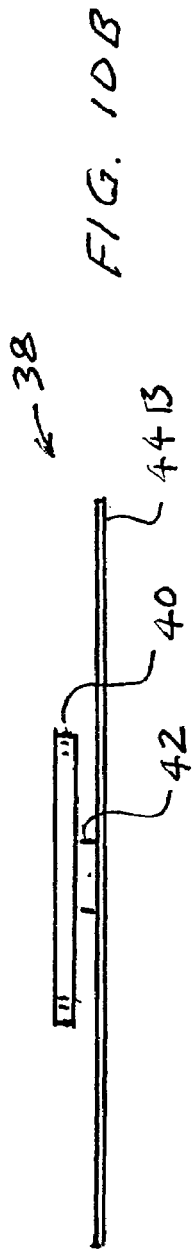

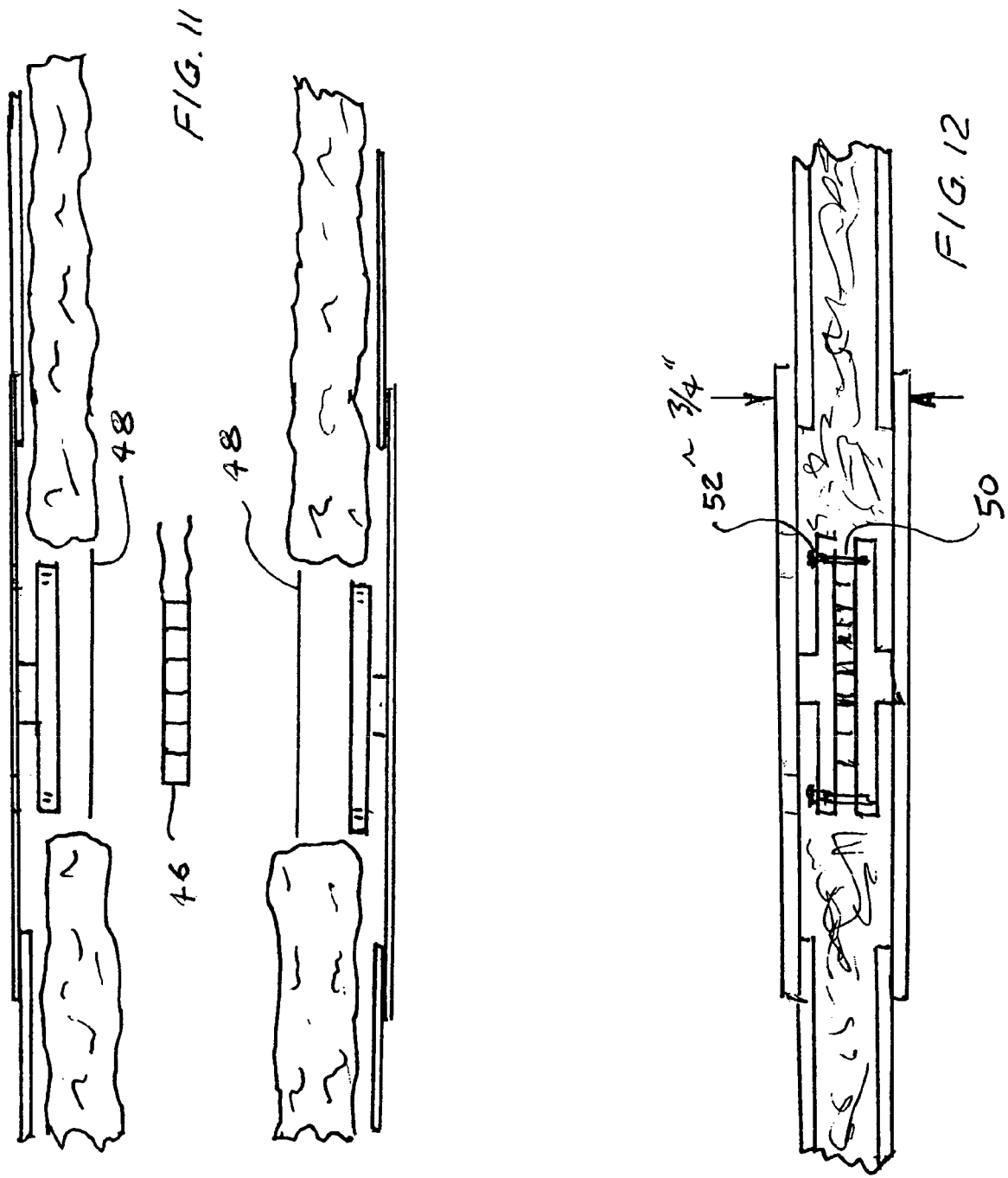

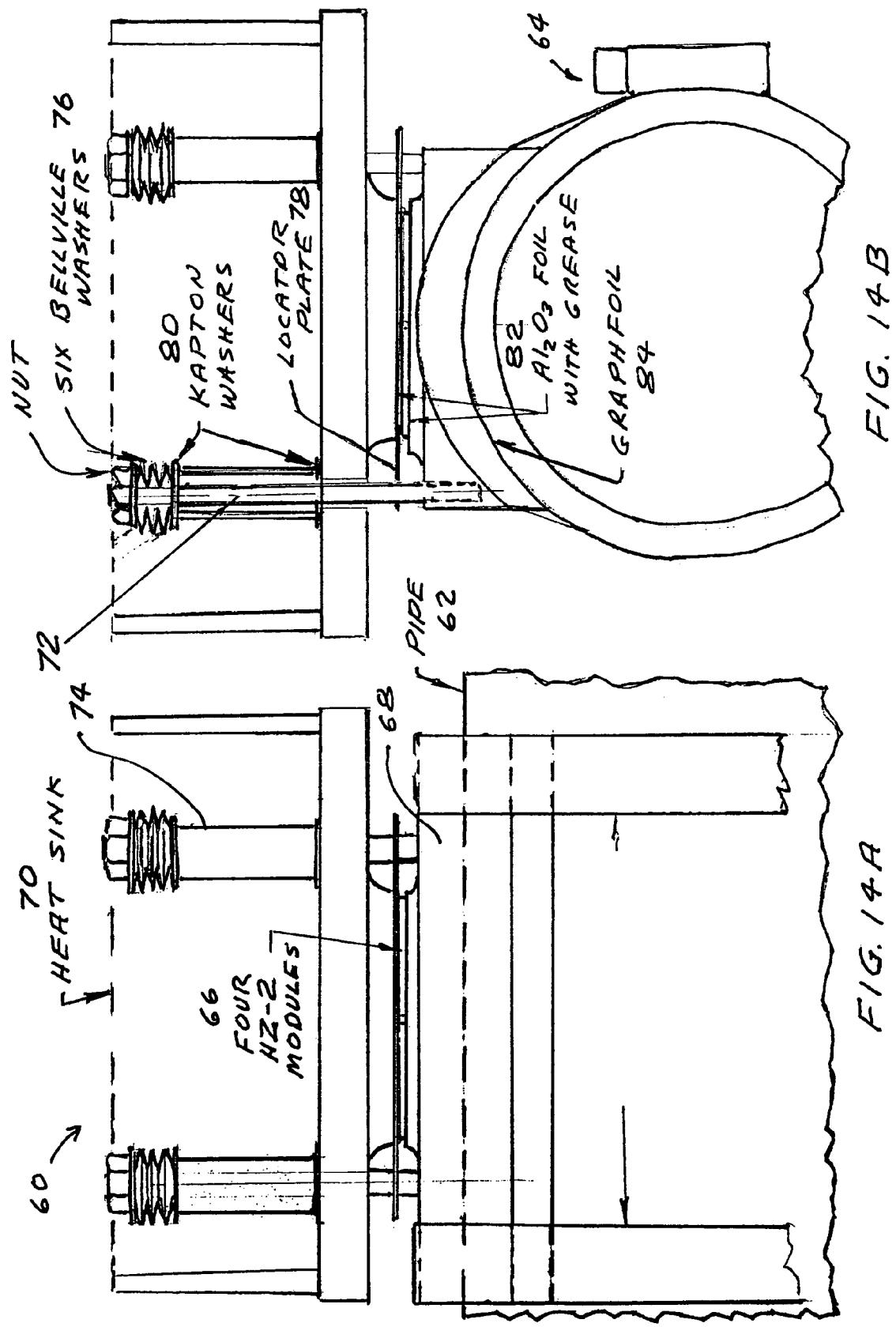

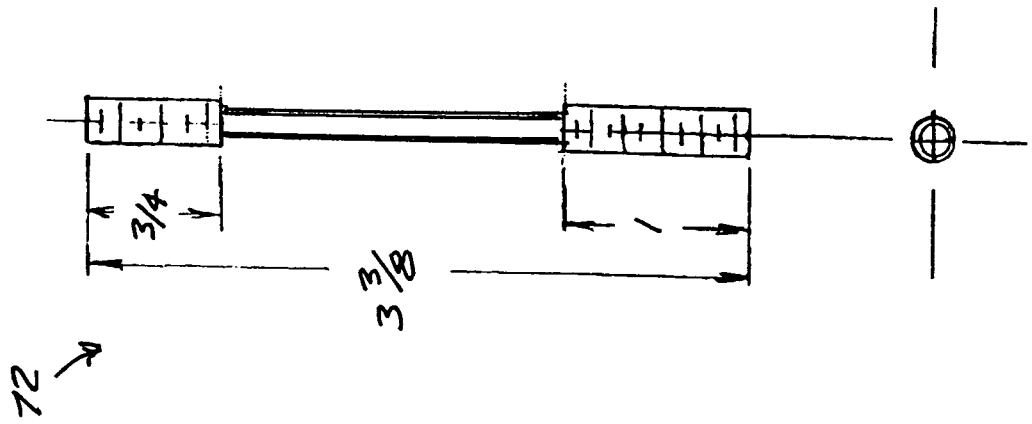
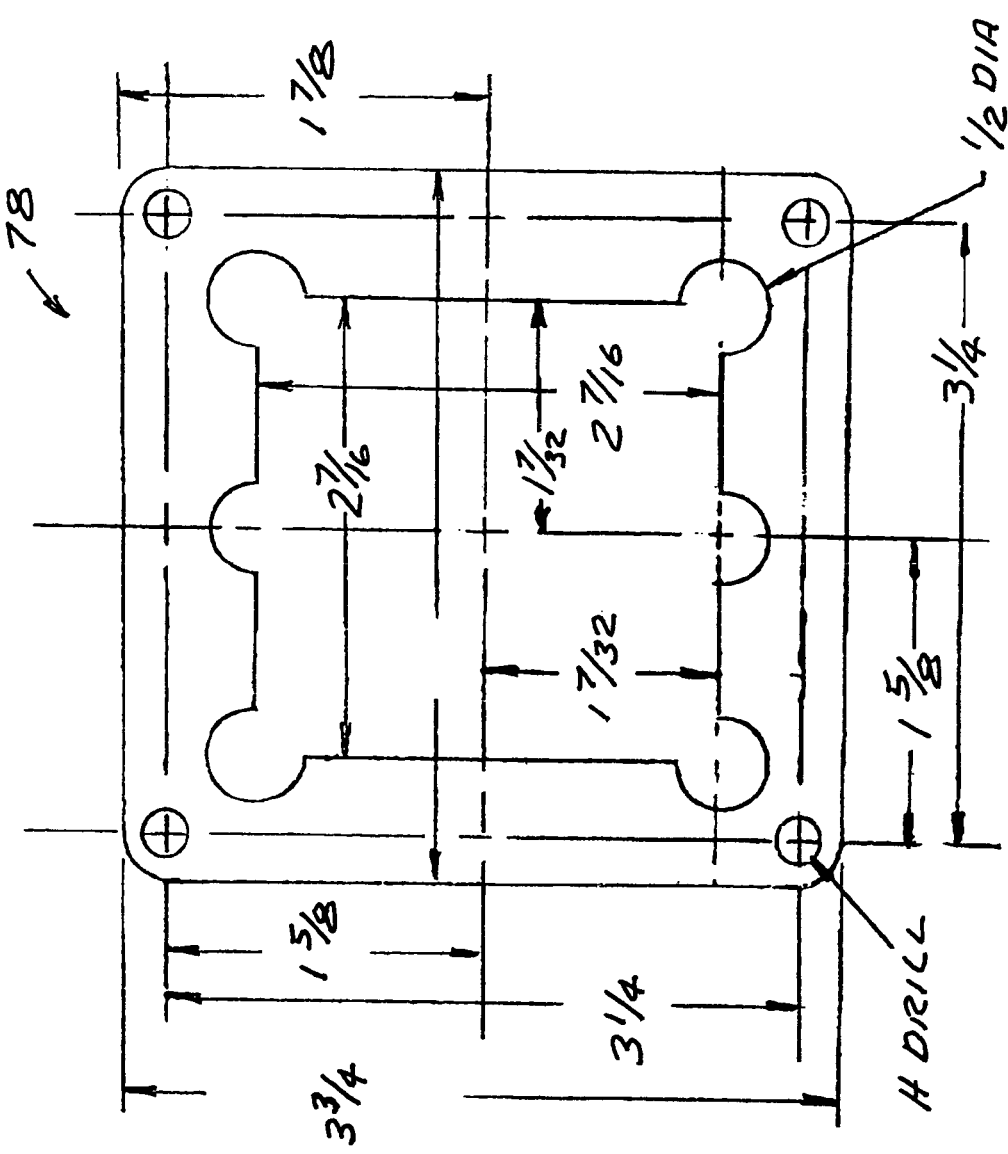

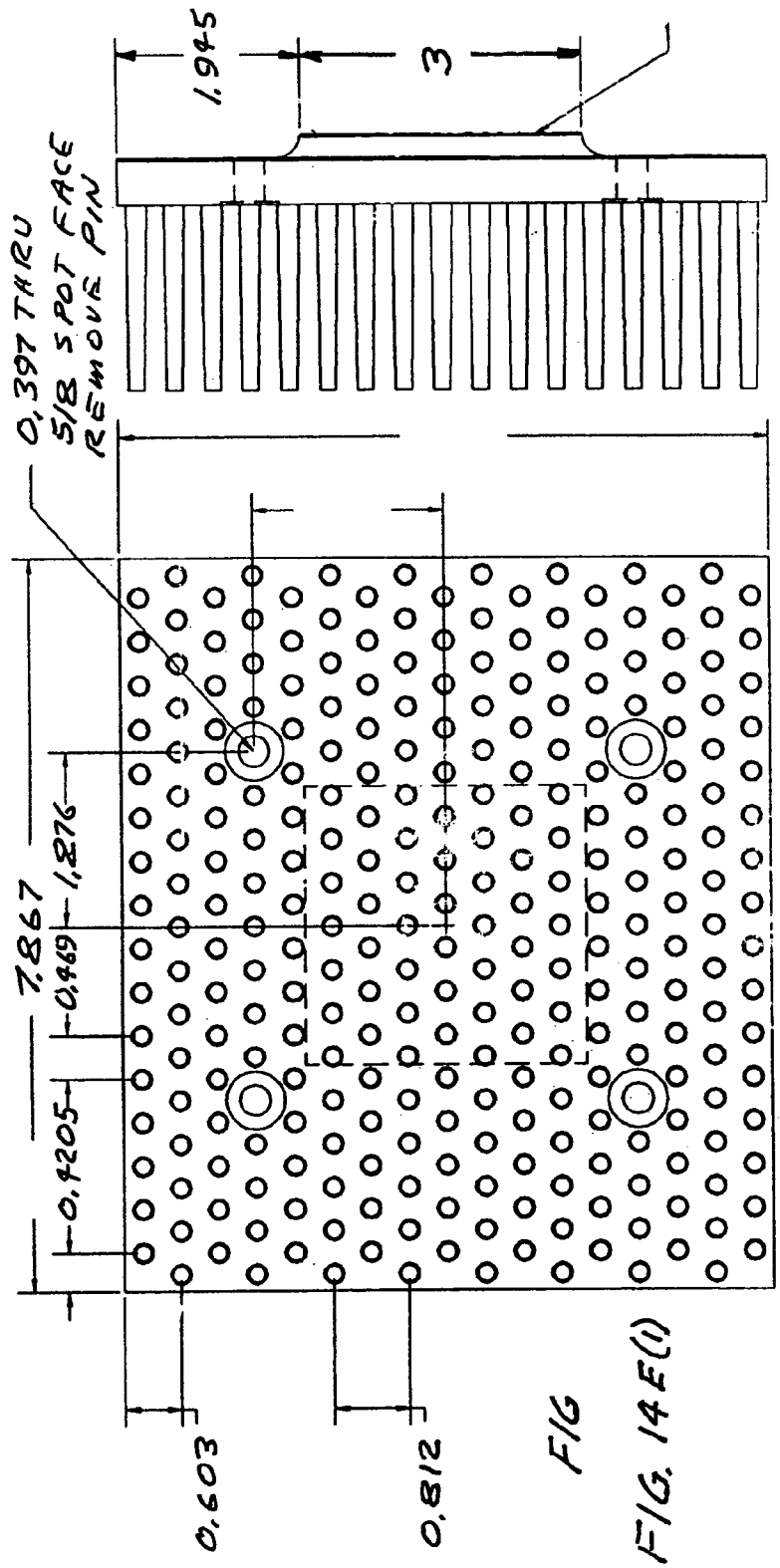
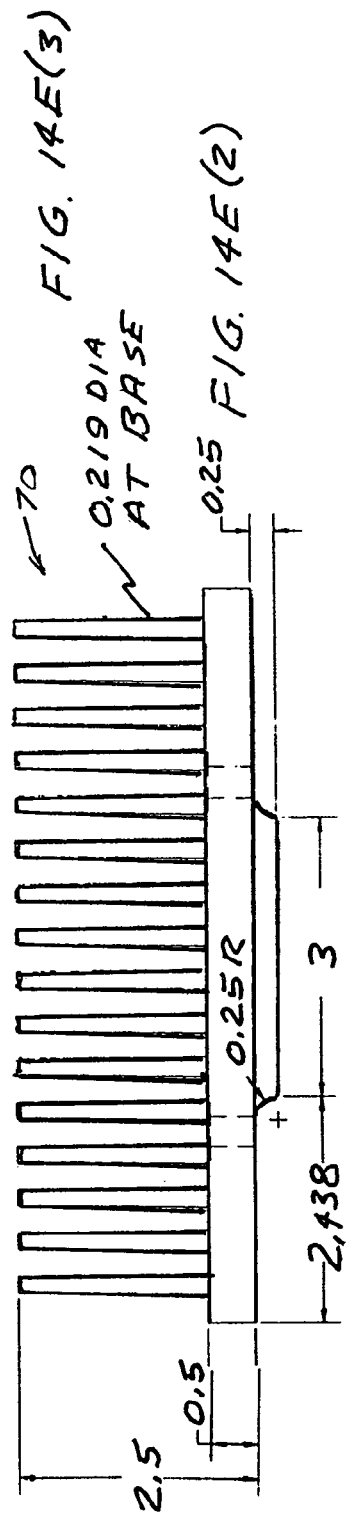
FIG. 14E(1)
FIG. 14E(2)
FIG. 14E(3)

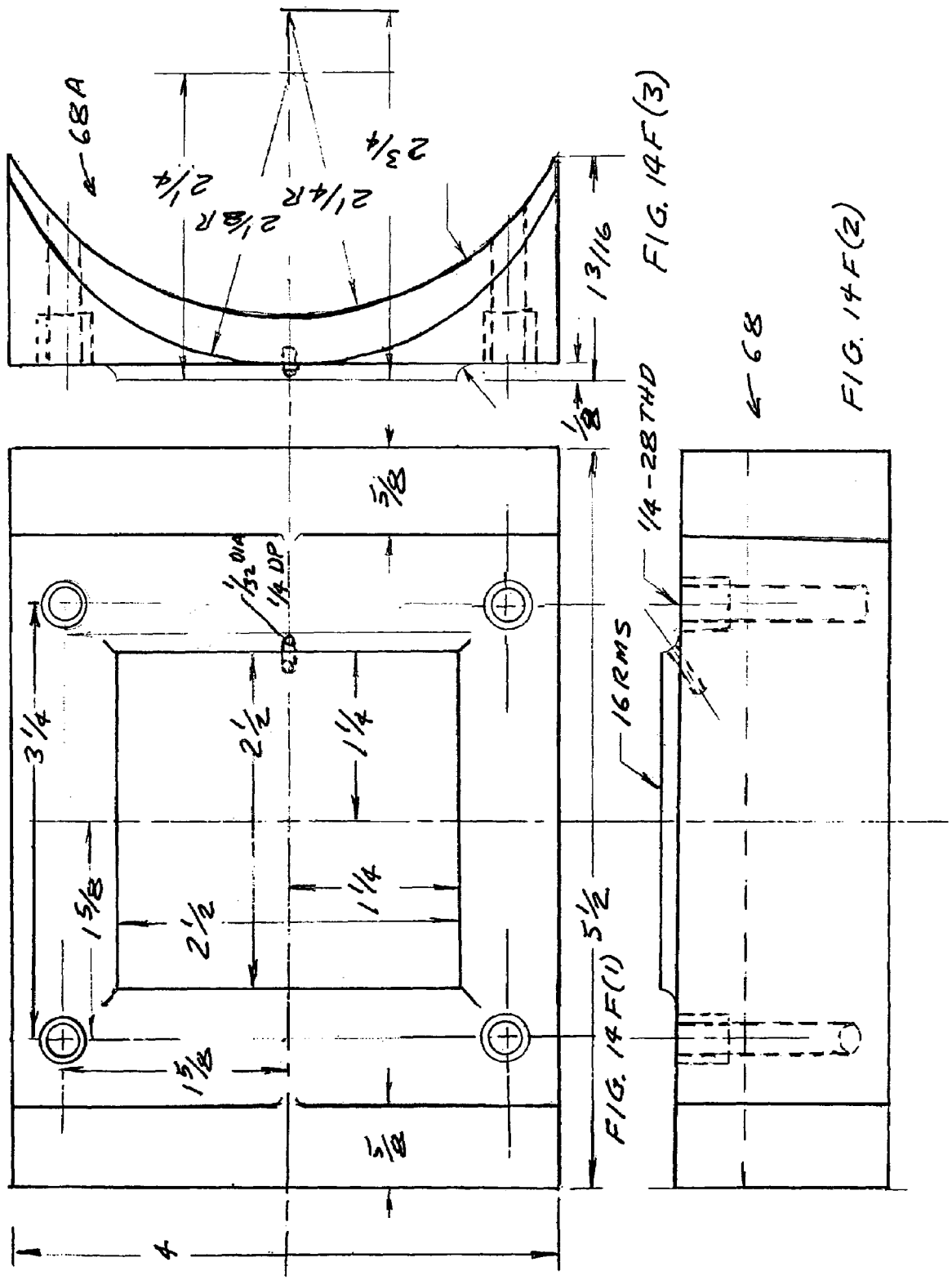

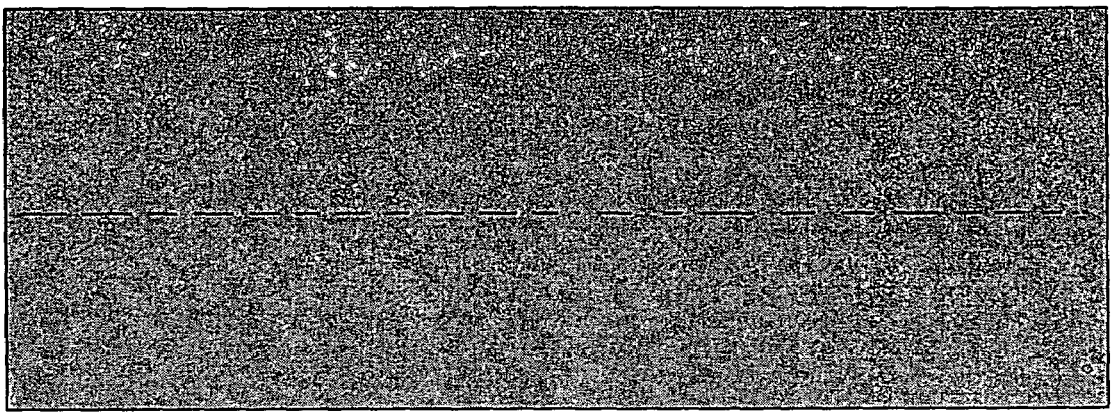
FIG. 15A
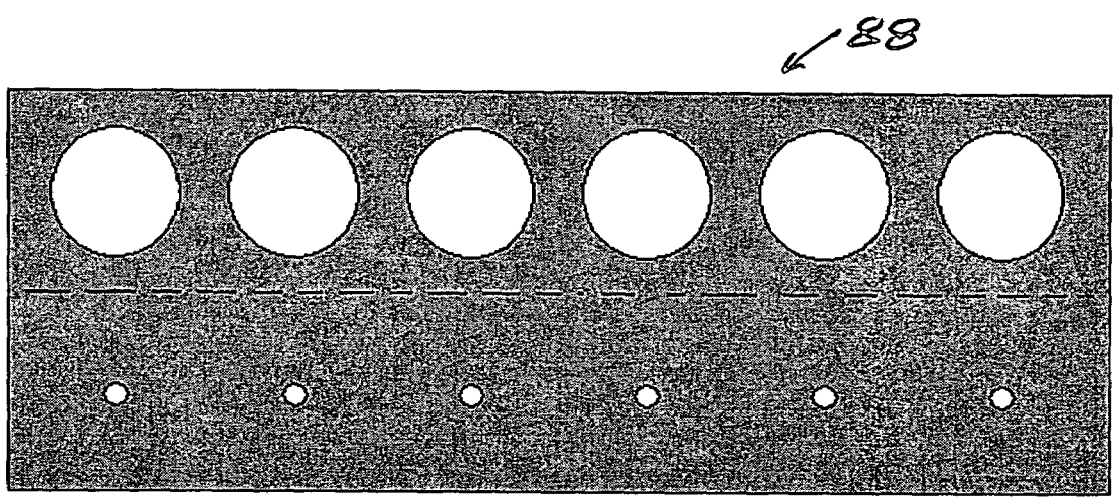
FIG. 15B
FIG. 15C(2)
FIG. 15C(1)
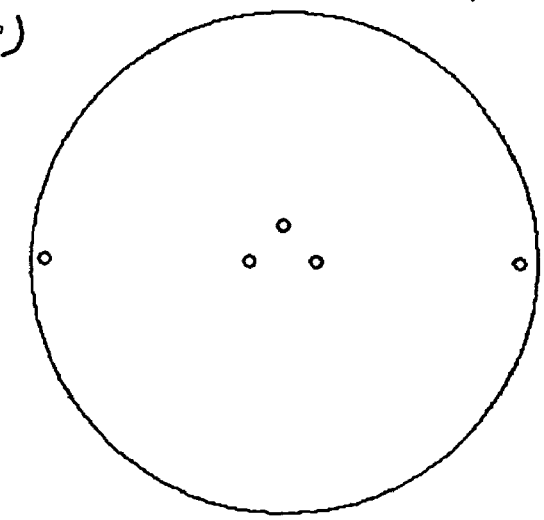

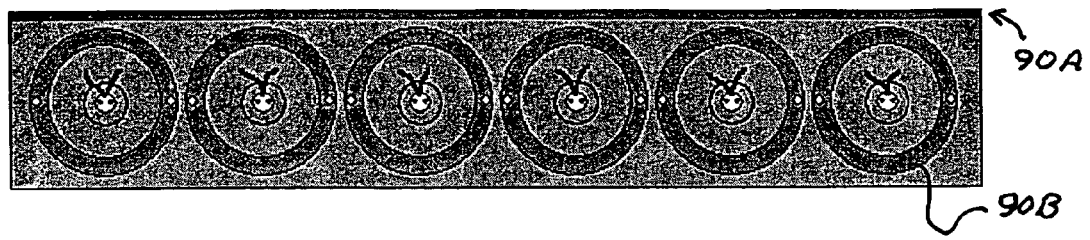
FIG. 15I
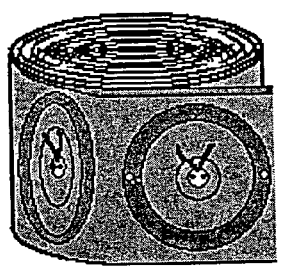
FIG. 15J
FIG. 15K
FIG. 15L
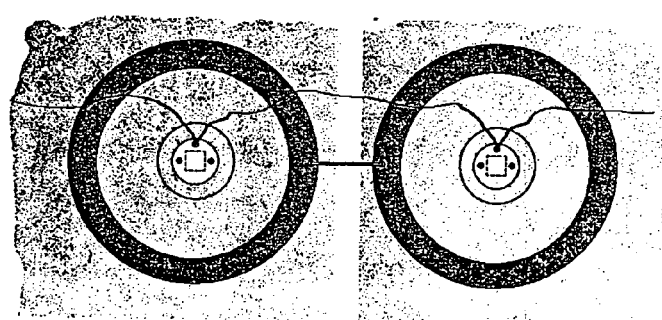
FIG. 15M
FIG. 15N

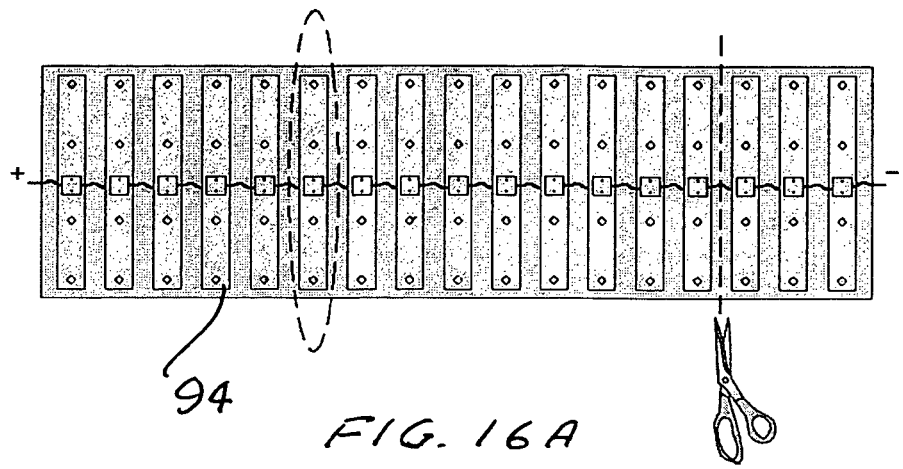
FIG. 16A
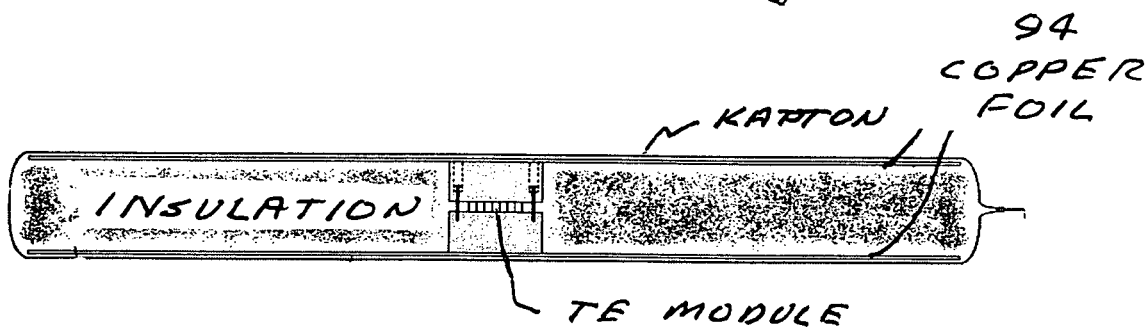
FIG. 16B
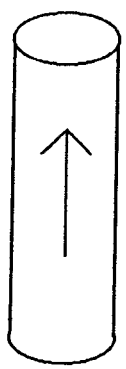 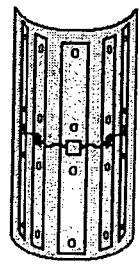 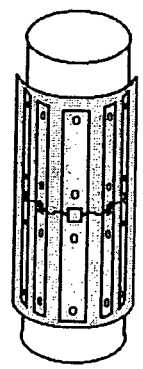 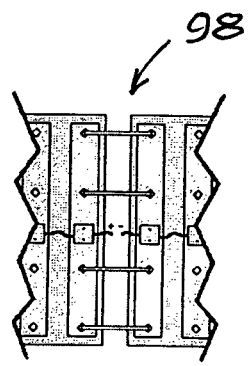
FIG. 16C    FIG. 16D    FIG. 16E    FIG. 16F

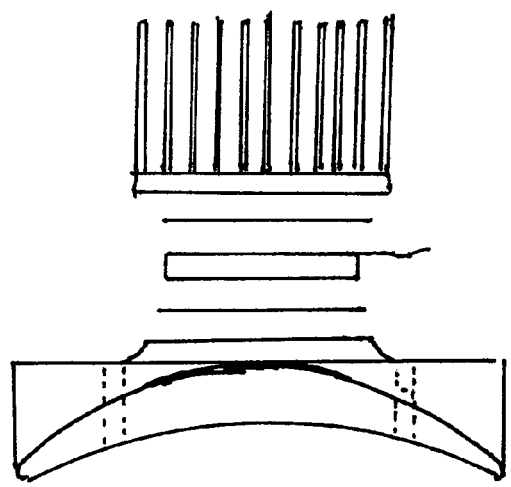
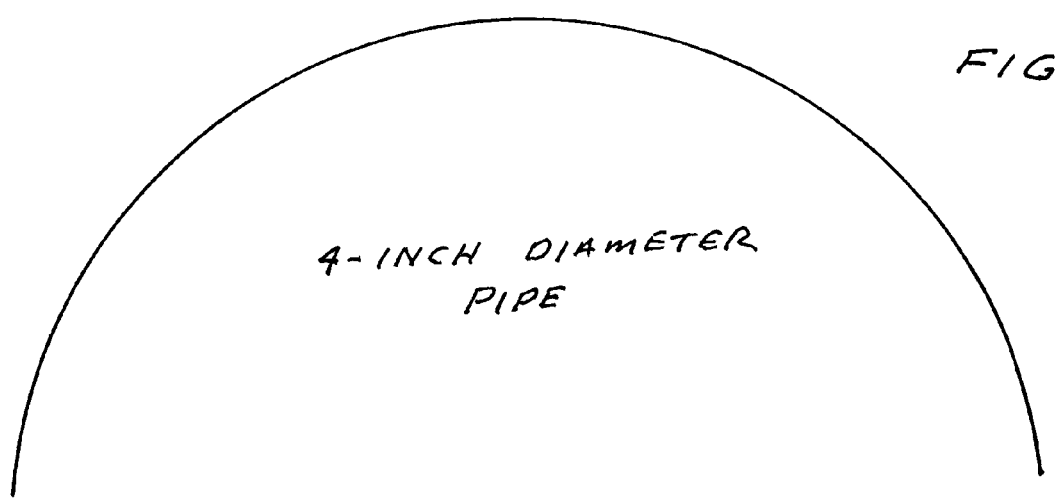
FIG. 17

THERMOELECTRIC DEVICE WITH SURFACE CONFORMING HEAT CONDUCTOR

The present invention relates to thermoelectric devices and in particular techniques for producing electric power from existing heat sources such as hot pipes. This application is a continuation in part of Ser. No. 11/138,741 filed May 25, 2005.

BACKGROUND OF THE INVENTION

A well-known use for thermoelectric devices is for the extraction of electric power from waste heat. For example, U.S. Pat. No. 6,527,548 discloses a self powered space heater for a truck in which heat energy for the heater is used to power electric components of the heater plus charge a battery. In U.S. Pat. No. 6,053,163 heat from a stovepipe is used to generate electricity. U.S. Pat. No. 6,019,098 discloses a self-powered furnace. Various types of thermoelectric modules are available. A very reliable thermoelectric module with a gap-less egg-crate design is described in U.S. Pat. Nos. 5,875,098 and 5,856,210. U.S. Pat. No. 6,207,887 discloses a miniature milli-watt thermoelectric module useful in space applications (and special applications on earth) in combination with radioactive heat source.

A typical thermoelectric module is Hi-Z Model HZ-2, commercially available from Hi-Z Corporation with offices in San Diego, Calif. It is a square module with 2.9 cm sides and is 0.5 cm thick. It produces about 2 watts at 4 volts when sandwiched between hot and cold surfaces with a temperature difference of about 200 degrees centigrade. This unit sells for less than $50.

Quantum well very thin layer thermoelectric modules are known. Some are described in U.S. Pat. Nos. 6,096,965, 6,096,964, 5,436,467 and 5,550,387. U.S. Pat. No. 6,624,349 describes an electric generator using a thermoelectric module to generate electric power from the heat of fusion produced by the freezing of a phase change material. All of the above referenced patents are assigned to Applicant's employer and they are all incorporated herein by reference.

Tracking and surveillance devices are available for tracking vehicles. Devices are available that can be attached to an motor vehicle that will transmit radio signals indicating the latitude and longitude of the motor vehicle to a monitoring stations. Trucking systems can use these systems to keep track of its vehicles as they traverse the United States. Police can attach these devices to motor vehicles of evil people to keep track of them. These devices are typically powered by batteries so that their useful life is limited. A typical tracking device is a Model ST-18 PTT available from Telonics, Inc with offices in Mesa Ariz. The unit operates at 4 volts and requires about ½ watt to transmit via the Argos tracking system. Argos is a satellite-based system in operation since the late 1970's and is utilized world wide to track just about anything from ships, to trucks to birds.

The phrase "magnetic materials" is a phrase generally applied to materials exhibiting ferromagnetism. In this patent application the phrase will be used to describe materials such as iron, nickel or cobalt and alloys of these material and products made from these materials and their alloys (such as tail pipes and mufflers) to which magnets are strongly attracted.

Most of the waste heat in industry, motor vehicles, commercial and residential situations is transported away in pipes. Only a very small portion of the energy in this waste heat is recovered.

What is needed is a product that can produce small amounts of electric power from a hot or cold surface and can be attached to the surface quickly and easily especially for the recovery of energy from waste heat.

SUMMARY OF THE INVENTION

The present invention provides a quickly attachable electric generator device for producing electric power from surfaces of hot or cold pipes. The invention provides a thermoelectric unit which includes a pedestal comprised of a material with high thermal conductivity on which a thermoelectric module is located. The pedestal includes a heat transfer element made to conform to a hot or cold cylindrical surface. The module also includes a module-to-air heat transfer element and the thermoelectric module is compressed between the air-to-module element and the pedestal. This element is referred to as a heat sink when energy is extracted from a hot surface and is referred to as a heat source when energy is flowing from the air and a cold surface. In preferred embodiments the heat transfer element is a thin flexible heat conductor that conforms to the hot or cold surface of various shapes and serves as a heat transfer conduit to transfer heat to or from a rigid portion of the pedestal. Electric energy is generated from the heat flowing through the module.

In preferred embodiments a number of thermoelectric units are contained in a cover useful for wrapping around hot or cold pipes or covering other hot or cold items. This embodiment is designed for low cost and ease of installation. Another preferred type of embodiment of this invention is a quick attachment thermoelectric device. The device includes at least one permanent magnet for providing a magnetic attractive force to hold a surface of a thermoelectric module against the hot or cold surfaces. In this preferred embodiment the module is utilized to provide electric power to power a transmitter to transmit information regarding the location of the motor vehicle to which it is attached. Standard thermoelectric modules available on the market can be utilized. Another preferred embodiment is designed especially to provide electric power to low use instruments at locations remote from utility electric power. This is a relatively high efficiency device in which the bottom of a metal pedestal is made to conform to the hot or cold surface. The thermoelectric module is held in compression between the pedestal and a fin unit and the pedestal is compressed against the hot or cold surface with a worm drive pipe clamp.

For highest module efficiencies quantum well modules are preferred with p-legs and n-legs, each leg being comprised of a large number of at least two different very thin alternating layers of elements. For applications where the temperature range is relatively low, a preferred quantum well choice is n-doped Si/SiGe for the n-legs and p-doped Si/SiGe for the p-legs. At higher temperatures the preferred quantum well legs are alternating layers of silicon and silicon carbide for the n-legs and for the p-legs alternating layers of different stoichiometric forms of B-C.

BRIEF DESCRIPTION OF THE DRAWINGS

FIGS. 1A through 6 show the steps of assembling a preferred embodiment of the present invention.

FIG. 7 show the preferred embodiment in use for tracking a motor vehicle.

FIGS. 8A and 8B show how to assemble a second preferred embodiment.

FIG. 9 is a pattern for cutting strips of Kapton for a thermoelectric cover.

FIGS. 10A and 10B are pedestal designs.

FIG. 11 shows a blow up of a module section of a preferred thermoelectric cover unit.

FIG. 12 shows the assembled module section.

FIGS. 14A through 14F(2) show various features of a preferred embodiment of the present invention.

FIGS. 16A through 16F show various features of yet another preferred embodiment.

FIG. 17 shows features of an embodiment similar to the FIGS. 15A through 15M embodiment.

DETAILED DESCRIPTION OF PREFERRED EMBODIMENT

First Preferred Embodiment

Quick Attaching Thermoelectric Device

Figure 13:
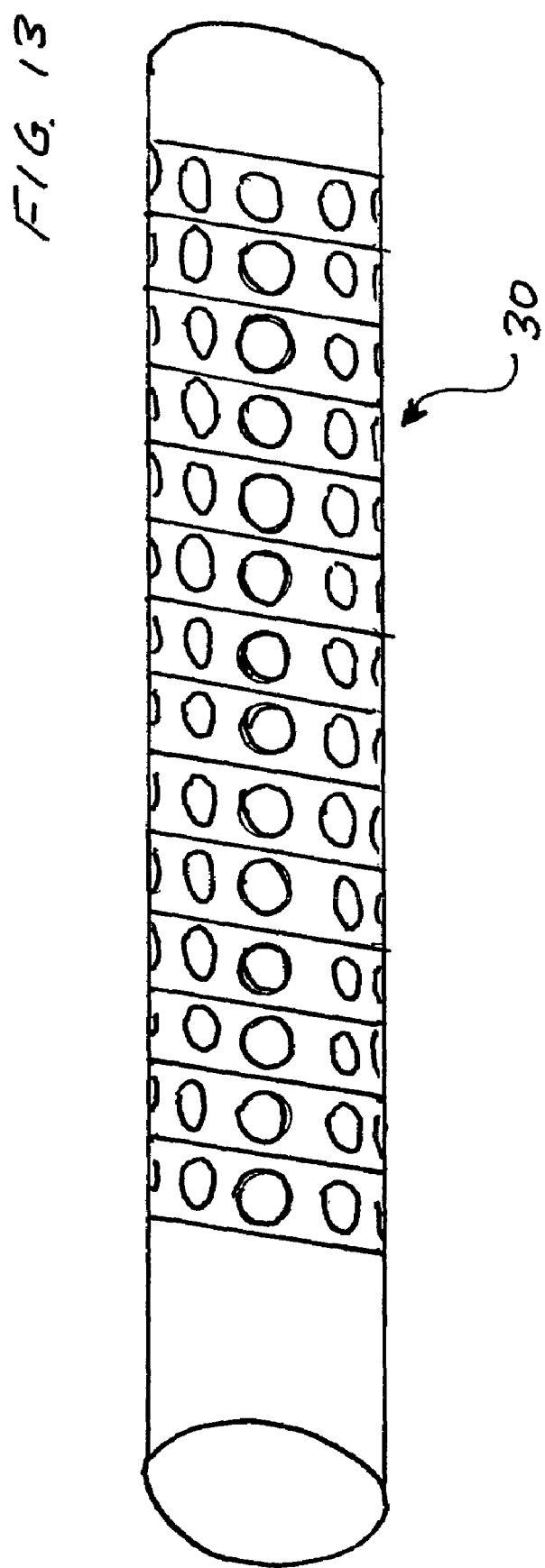
FIG. 13 shows a seven foot section of an 18-inch pipe wrapped with a 60-foot length of thermoelectric cover.

FIGS. 1A through 7 show the basic features of a first preferred embodiments of the present invention. In this embodiment a thermoelectric generator is attached to a cylindrical steel tail pipe of a motor vehicle with the magnetic force of a plurality of magnets that compresses a thin flexible high heat conducting element against the tail pipe. Preferably, the thin flexible high heat conducting element is a thin copper disk and it is braised to a thin bottom portion of a copper pedestal that has a wider flat upper portion. The wider flat upper portion is the heat source of a thermoelectric module that is compressed between an aluminum fin unit functioning as a heat sink and the flat upper portion of the pedestal. Insulating wafers on both the hot and cold sides to the thermoelectric module provide electrical insulation of the module from the copper pedestal and the finned heat sink. Heat conducting grease is used to improve thermal conductivity. In this preferred embodiment 24 small cylindrical magnets are positioned around a mid section of the pedestal in 12 aluminum bottomless cups between the thin copper disk and the wide flat portion of the pedestal. When in use the thin flexible disk conforms to the shape of the steel (or other iron containing material) surface to which it is attached, and the disk along with the rest of the thermoelectric generator is held in place by the magnetic force of the 24 magnets.

FIGS. 1A, 1B and 1C show a preferred pedestal 4 for the first preferred embodiment. It is machined from copper. The wider flat upper portion 4A has a top surface with a diameter of 1.625 inches, a 0.551 inch diameter middle section 4B and the thin bottom portion 4C has a diameter of 0.315 inch. The thin flexible copper disk 6 is 10 mils thick and has a diameter of 1.625 inches. It is braised to the bottom surface of the pedestal as shown in FIG. 4. Twelve bottomless cups 8 for holding the magnets 10 are made from ⅝ inch aluminum streamline tubing by cutting the tubing into 0.47 inch lengths. One of those cups is shown in FIG. 3A. FIG. 3B shows two magnets 10 positioned in the cup. The magnets are samarium cobalt magnets, 0.47 inch in length. The diameter of the inside magnet is 0.203 inch and the diameter of the outside magnet is 0.234 inch. The magnets are available from Chen Yang Engineering located at Franz-Brombach-STR 11-13, D-85435 Erding, Germany. The parts of the thermoelectric generator are shown blown up in FIG. 4. These parts include pedestal 4, cups 8 and magnets 10. The thermoelectric module used in this preferred embodiment is a 2½ watt thermoelectric module, Model HZ-2 available from Hi-Z corporation with offices in San Diego, Calif. It is 1.15 inch square and 0.2 inch thick. It produces more than 2 watts at 4 volts with a 365 degree F. (300 degree C.) hot to cold temperature difference. The finned heat sink 12 is a molded aluminum fin unit that is available commercially from Alpha NovaTec located at 4733 Sapena Ct. #15, Santa Clara, Calif. 95054. The preferred unit has a square flat surface with sides 1.8 inches long. Its thickness to the tips of its thin cylindrical fins is about 1 inch. The thermoelectric module is electrically insulated from heat sink 12 and pedestal 4 by 10-mil thick alumina wafers 14. Heat conducting grease such as a mixture of 30% diffusion pump oil and 70% boron nitride is applied at each heat transfer intersection to improve heat conductivity. The bottomless cups are held in place by a thin wire that is run through holes 16 located at the bottom of the cups 8. The cups can be installed around the pedestal as follows: Drill a small hole in the outside surface of one of the cups, the "first cup". Cut a 6 inch length of thin flexible wire and form a 0.1 inch loop in one end of the wire. String the other end through hole 16 of the first cup then through hole 16 of the other eleven cups. Then run, the end of the wire through the 0.1 inch loop. Place the cups around pedestal 4 and tighten the wire so that the twelve cups encircle pedestal 4 closely, but with some room to allow the cups to move radially with respect to the wire. Wrap a portion of the loose section of the wire around the screw and cut off the excess portion of the wire. FIG. 5 shows the thermoelectric generator 2 fully assembled. FIG. 6 shows the location of magnets 10. FIG. 7 shows generator 2 attached to the surface of a cylindrical tail pipe. This unit attaches equally well to any cylindrical, spherical or flat surface and other surface shapes as long with radii of curvature of more than about 1½ inch. The surface should be relatively clean. A little heat conducting grease will usually improve performance. The FIG. 7 drawing shows generator 2 providing power to a transmitter such as Model ST-18 PTT available form Telonics, Inc with offices in Mesa, Ariz.

Second Preferred Embodiment

Quick Attaching with Rectangular Bottom

A second preferred embodiment of the present invention is shown in FIGS. 8A and 8B. This unit is exactly the same as the generator of the first preferred embodiment except the thin bottom part of pedestal 4 is rectangular rather than circular. This second preferred embodiment is useful for attachment to flat and cylindrical surfaces but would not attach very well to spherical surfaces. Also, when attaching it to cylindrical surfaces care must be taken to line it up with the axis of the cylindrical surface. It should attach very well however to tail pipes and mufflers of motor vehicles.

Third Preferred Embodiment

Thermoelectric Blanket with Top and Bottom Copper Foils

FIGS. 9 through 13 describe a preferred embodiment in which a number of thermoelectric units are contained in a cover 30 as shown in FIG. 13 useful for wrapping around hot or cold pipes or covering other hot or cold items. A particular preferred embodiment is a cover 6 inches wide with thermoelectric modules spaced at 5-inch centers. Top and a bottom 6 inch wide 10 mil thick Kapton sheets 32 form the structure of the cover. The sheets may be any length, but in this particular embodiment they are about 60 feet. Three-inch diameter holes 34 are cut in the along a center line of both top and bottom sheets at 5-inch centers. Top pedestal 36 and bottom pedestal 38 each about ¼ inch high and having a wide diameter part 40 and a narrow diameter part 42 are each braised at its narrow surface to a thin flexible heat conductor 44A and 44B, preferably 10 mil thick 4-inch diameter copper foil. The foils are then thermally fused to cover the three-inch diameter holes 34 in the top and bottom Kapton sheets. A long sheet 5 inches by 60 feet of thermal pipe insulation is prepared by cutting 1.75-inch diameter holes in the sheet at 5 inch centers. The insulation may be two layers of with each about ⅜-inch thick as shown in FIG. 11 with the conductors passing between the layers. Or a single layer of about ¾-inch thick may be used with the conductors passing under the top Kapton layer. The insulation is laid over the bottom Kapton sheet with a bottom pedestal protruding partially through each 1.75-inch hole in the insulation. Next, a thermoelectric module 46, preferably a Hi-Z Model HZ-2, with two 10 mill alumina insulators 48 are sandwiched between each of the 144 top and bottom pedestals using two small screws 50 with Belleville washers 52. The modules are connected in series. The finished product is a 30-foot long 6-inch wide thermoelectric cover. The cover is now available for covering a hot or cold pipe to produce electrical power from the heat flow out of or into the pipe. With this embodiment the pipe diameter should be at least 18 inches. The user may cut the series connections between modules as appropriate to produce desired voltage outputs that will depend in part on the expected temperature differences between the top and bottom pedestals. For example, the Model HZ-2 produces about 2 watts at 4 volts with a 365 degree F. (300 degree C.) hot to cold temperature difference. Preferably, the cover is wrapped spirally around the pipe as shown in FIG. 13, but other techniques of wrapping may be used. Many variations of this embodiment are possible. A seven-foot section of an 18-inch pipe wrapped with 60 feet of thermoelectric cover comprising 144 thermoelectric modules each producing about 2 watts will produce about 288 watts with a temperature difference of about 300 degrees C.

Fourth Preferred Embodiment

Clamp-On Thermoelectric Generator

A device designed especially to be clamped onto hot pipes to provide electric power for remote sensors can be described by reference to FIGS. 14A through 14F(2). The device is shown at 60 clamped on to pipe 62 with worm drive pipe clamp 64. Four HZ-2 thermoelectric modules shown at 66 are held in compression between pedestal 68 and heat sink fin unit 70 with four threaded studs 72, four spacers 74, with six Bellville washers 76 on each stud providing the compression. A thin locator plate 78 assures proper positioning of the four modules and Kapton washers 80 (two each spacer) insulate the fin unit from the studs. Two alumina foils 82 provide electrical insulation for the module as shown in FIG. 14B and thermoelectric grease of the type described above is used to minimize temperature drop at the interfaces. A thin sheet of graphfoil 84 is applied between the surface conforming portion of pedestal 68 and the surface of pipe 62. Details of the locator plate 78 are shown in FIG. 14C. Details of the studs are shown in FIG. 14D. The threads have been removed from the central portion to the studs. Details of the finned heat sink 70 is shown in FIGS. 14E(1) through 14E(3). It is an aluminum casting with the bottom surface machined very flat to provide good the temperature conduit to the modules. The pedestal 68 is shown in FIGS. 14F(1) to 14F(3). The reader should note at 68A in FIG. 14F(3) that the bottom portion of the pedestal is designed with a 2¼ inch cylindrical radius to conform the outside surface of a standard 4-inch steel pipe.

Figure 14G:
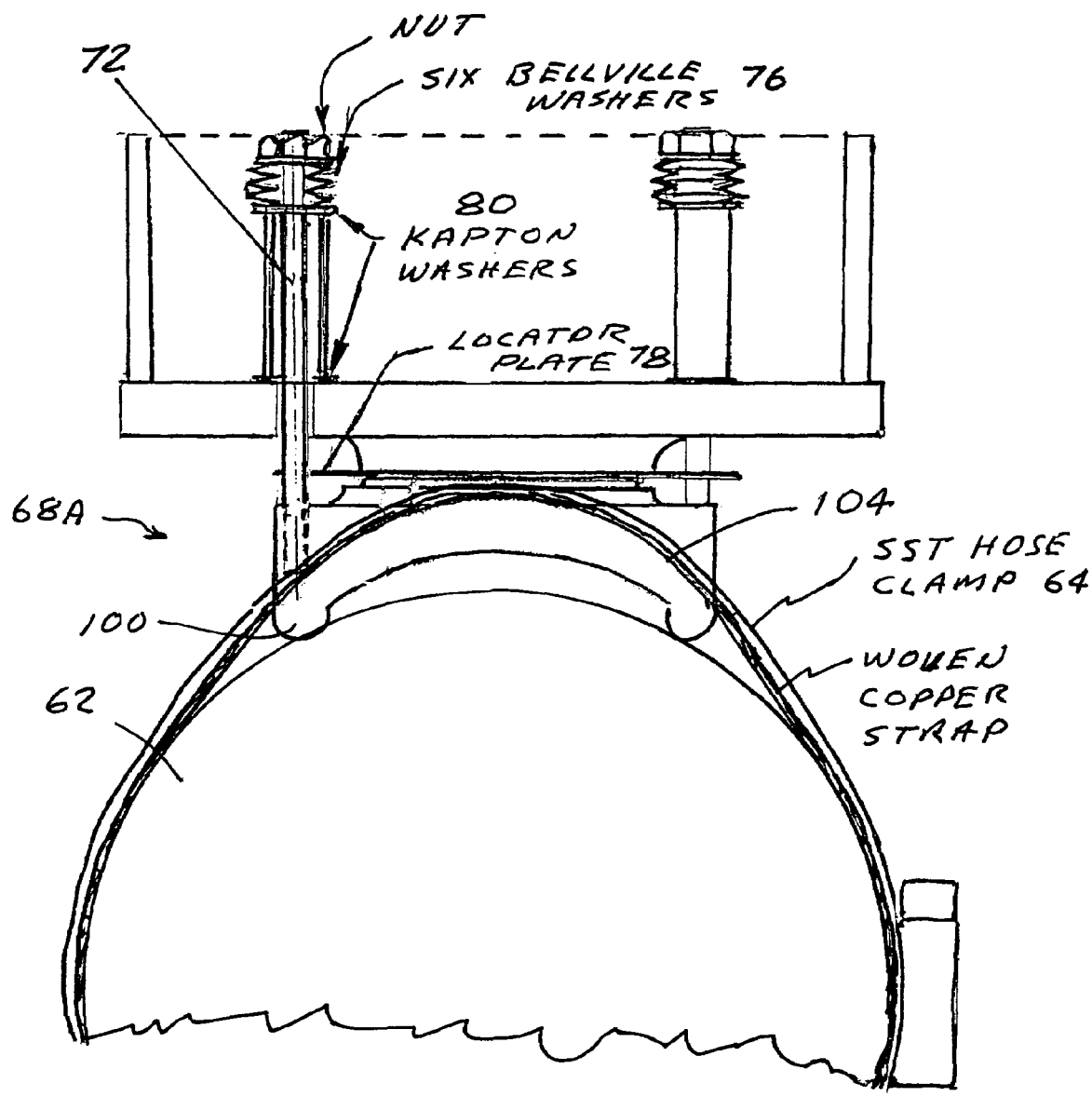
FIG. 14G shows a preferred embodiment similar to the above embodiment designed to fit a large range of pipe sizes.

A variation of the embodiment described above that can fit on any of a wide range of pipe sizes is shown in FIG. 14G. In this embodiment pedestal 68A has a bottom portion that has two linear tabs 100 that contacts pipes of a range of sizes along two lines coaxial with the pipe axis. Heat transfer to the pedestal is provided primarily by a highly conductive flexible strap such as woven copper strap 102 that is tightly compressed against the rounded portion 104 of pedestal 68A and most of the circumference of the pipe 62 by stainless steel hose clamp 64. A thin sheet of Grafoil (available from Union Carbide) may be inserted between the strap and the pipe.

Fifth Preferred Embodiment

Low Cost Blanket

Figure 15D:
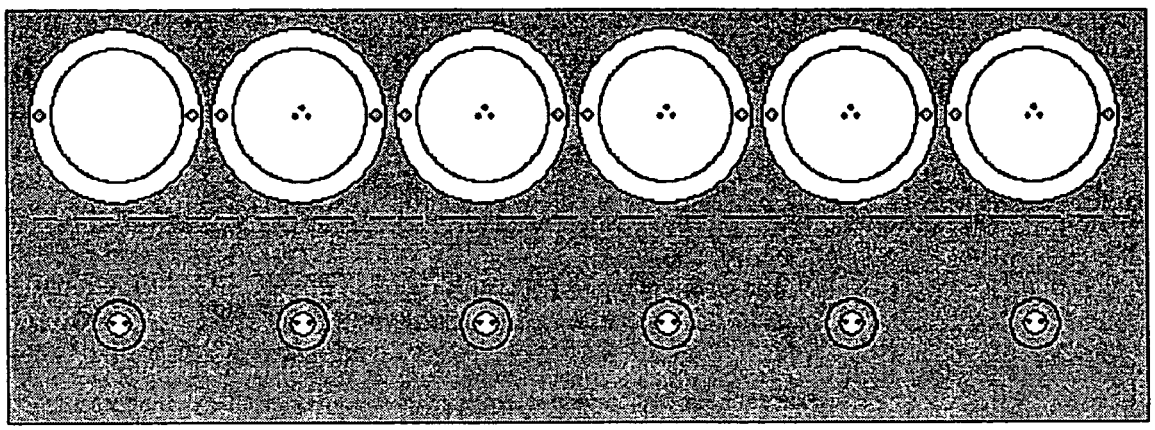
FIGS. 15A through 15N show various features of another preferred embodiment of the present invention.
Figure 15E:
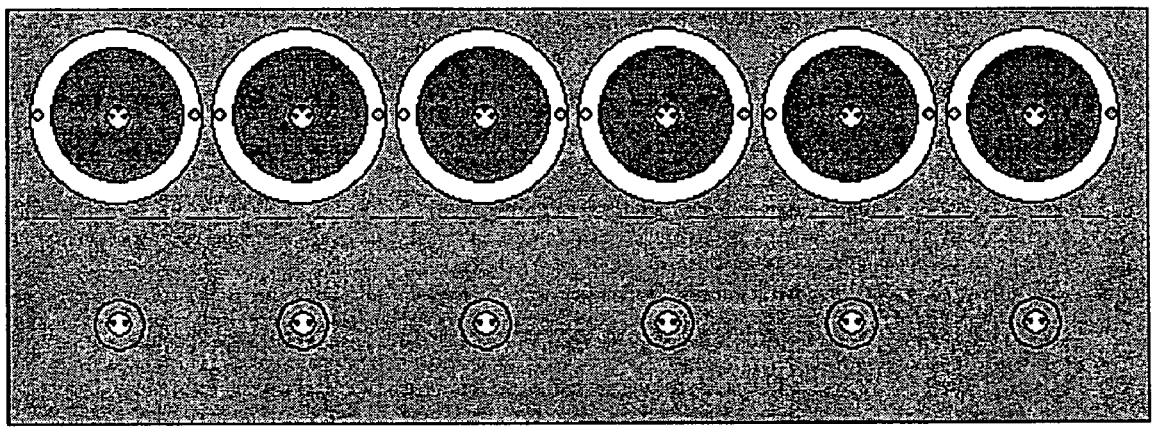
Figure 15F:
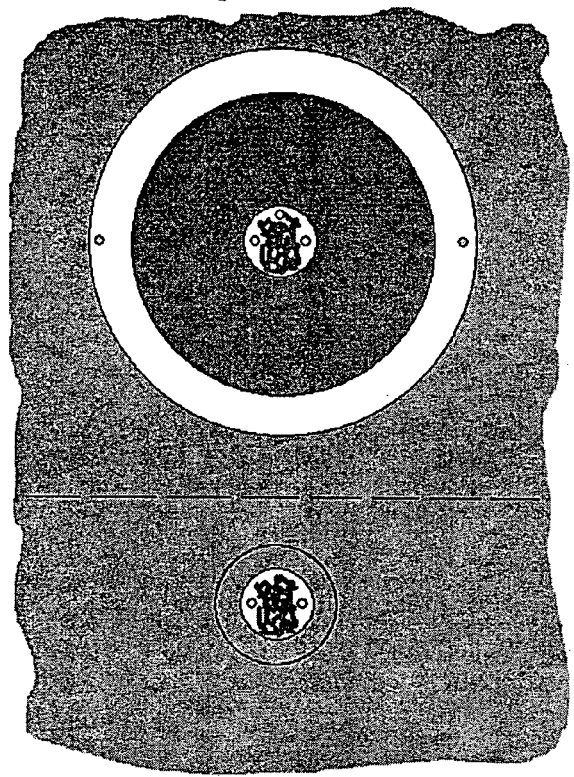
Figure 15G:
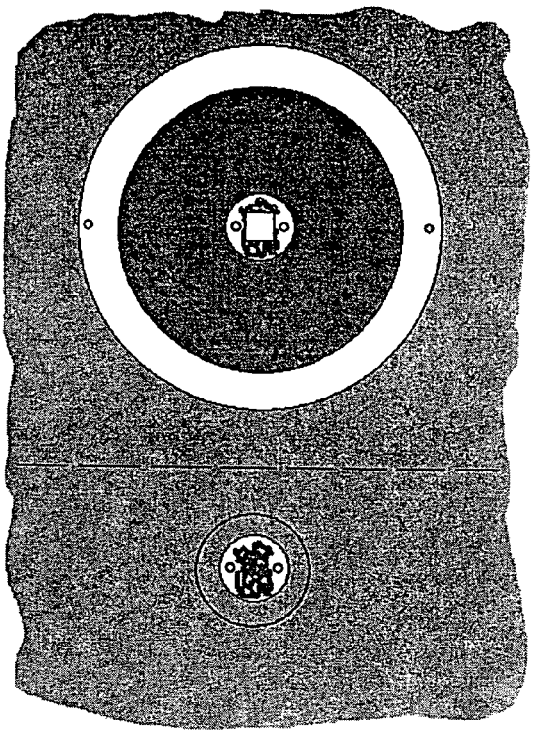
Figure 15H:
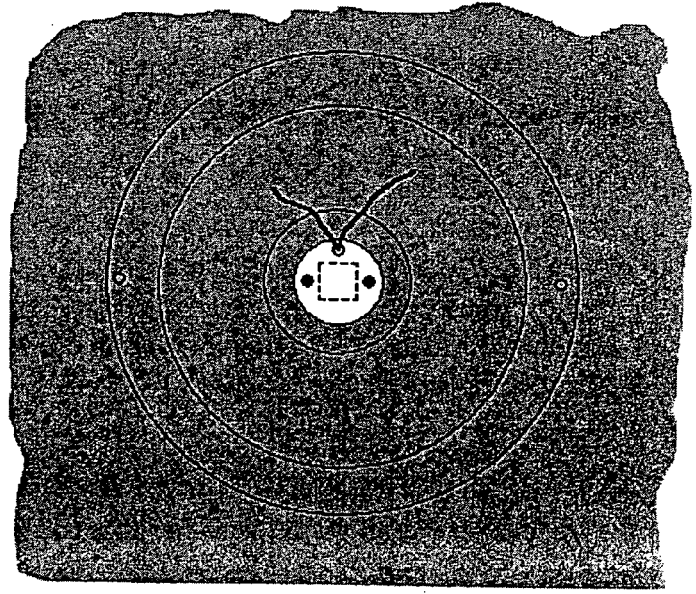

A fifth preferred embodiment is another low cost blanket type thermoelectric generator. A preferred technique for making it is described by reference to FIGS. 15A through 15M. Prepare a long (can be any length) 64 inch wide section of 10 mil thick Kapton or Teflon as shown in FIG. 15A. Draw a center line. Punch 14-inch and 2-inch holes as shown at 88 in FIG. 14B. Cut ¼-inch aluminum plates with diameter or 4 inches and cut #1 size screw threads through the plates. Punch 16 inch diameter flexible plates from copper sheet 10 mils thick. Cut two #1 size holes, two ½ inch holes on the edge of the plate and one ¼ inch hole just above the center all as shown in FIGS. 15C(1) and (2). Lay the small plates under the small holes in the big sheet and the big plates on top of the big holes in the big sheet such that they are centered on the holes. Thermally bond the plates to the sheet at 300 degrees C. In a long sheet of ¼-inch pipe insulation cut out 14-inch diameter holes to conform the position of the copper plates. Add heat transfer grease as shown in FIG. 15F. Place a HZ-2 thermoelectric module on each big plate and push the module wires through the ¼-inch hole. Fold the sheet about the centerline and fasten the plates together such that the module is in compression with two wires extending from the blanket for each module as shown in FIG. 15H. Thermally bond the outer rim of the larger plate and thermally bond the outside edge of the sheet to itself as shown at 90A and 90B in FIG. 15I. Store the blanket in a roll as shown in FIG. 15J. To apply the blanket to a hot pipe, first coat the pipe with heat transfer grease as shown in FIG. 15K. For large diameter pipes, the blanket can be applied as shown in FIGS. 15L and 15M. Connect the modules in series or series and parallel as desired. For smaller diameter pipes the blanket can be applied as indicated in FIG. 13.

Sixth Preferred Embodiment

Flexible Strip Blanket

A sixth preferred embodiment is shown in FIGS. 16A through 16F. This embodiment is similar to the third and fifth embodiments. However, the copper foils are long rectangular foils at 94 as shown in FIGS. 16A and 16B. The blanket is applied to pipe 96 as shown in FIGS. 16C through 16F. The blanket is secured with high temperature zip ties as shown at 98 in FIG. 16F.

Seventh Preferred Embodiment

Low Power Clamp-On Generator

FIG. 17 shows a preferred embodiment very similar to the embodiment shown in FIGS. 14F through 14F(2) except it is much smaller and one HZ-2 module is utilized. This unit uses a fin unit similar to the one shown in FIGS. 14E(1), (2) and (3) but with a 1-inch square bottom surface instead 3 inches as shown in FIG. 14E(3). Heat sinks similar to these are commercially available from Alpha Novatech with offices in Santa Clara, Calif. This generator is especially useful when only a very small amount of electric power is needed in a remote location and where a hot pipe is available.

DC to DC Converters

As indicated in the Background section of this specification a typical thermoelectric module, Hi-Z Model HZ-2, produces about 2 watts at 4 volts when sandwiched between hot and cold surfaces with a temperature difference of about 200 degrees centigrade. When thermoelectric devices of the types described above are to be used to supply electric power to particular equipment, it may be necessary or desirable to provide a step-up or step-down converter to produce the voltage needed for the equipment. Such converters are commercially available from suppliers such as Maximum Integrated Products, INC. with offices in Sunnyvale, Calif. For example, in several applications Applicants have utilized the MAX608 1A step-up converter that can step up voltages as low as 2 volts up to 16.5 volts with efficiencies of better than 80 percent in the current range of 20 mA to 1 A. These converters will automatically maintain output voltages approximately at a selected value regardless of the input voltage so long as the input voltages and output current is within specified ranges.

While the above description contains many specificities, the reader should not construe these as limitations on the scope of the invention, but merely as exemplifications of preferred embodiments thereof. Those skilled in the art will envision many other possible variations within its scope. For example:

The device can be used in reverse with cold pipes where electrical power is generated by heat flow from the warmer air to the cold pipe.

Many thermoelectric modules could be utilized other than the HZ-2 module. When they are commercially available at reasonable cost, quantum well modules can be used.

The bismuth telluride N and P legs used in the thermoelectric module can be replaced by other types of thermoelectric materials including nanostructures such as quantum wells, quantum wires, and quantum dots.

The samarium cobalt magnets can be replaced by other high temperature magnets in the first embodiment.

The electrical insulators can be replaced with heat transfer grease that is electrical insulating such as a mixture of diffusion oil, boron nitride, and diamond dust.

The pedestals can be made of materials other than copper and aluminum.

If the heat source or heat sink is flat, a thicker conforming plate may be used because flexibility is not needed.

Multiple devices can be attached together using flexible attachments so that higher voltages and power can be obtained.

More than one module can be sandwiched between the pedestal and the heat sink fins in each of the embodiments. These modules may be electrical connected in series or parallel.

Instead of brazing the copper plate to the pedestal, a screw, clamp, rivet, or other mechanical fastening mechanism may be employed.

High-temperature thermal insulators, such as Teflon PFA, may be used in each of the embodiments as washers to thermally isolate the compression bolts that hold the module in place. These washers will increase the device power and voltage because less heat will leak through the compression bolts.

In the first embodiment the tracking unit can be attached to the top of the heat sink and separated using thermal isolating washers such as Teflon PFA.

Wires may be used to compress the module instead of bolts.

The heat sink and pedestal can be made as one piece with the slot for the module to slip in to along with a highly thermal expansion material so that upon heating the module will experience a compressive force.

Belleville washers in all of the embodiments can be used on each bolt to increase uniform loading on the module.

The copper plate can be sliced into multiple sheets, like ma pie, to increase the plate flexibility.

In the third fifth and sixth embodiments the outside foils can be cut and bent outwardly to create cheap fins to improve heat transfer to the air.

A single bolt can be used to compress the module, instead of two bolts, if one side of the fined heat sink is fixed to the pedestal at the module height.

Accordingly, the reader is requested to determine the scope of the invention by the appended claims and their legal equivalents, and not by the examples which have been given.

We claim:

1. A quick attachable electric generator device for producing electric power from outside surface of a pipe, said device comprising:

A) at least one heat conducting pedestal with flat top surface and a heat transfer element conforming to and in thermal communication with said outside surface, B) at least one magnetic clamping means to hold said heat transfer element in compression against said outside surface, wherein said magnetic clamping means comprises a plurality of permanent magnets positioned around the pedestal in bottomless cups, C) at least one heat sink element, and D) at least one thermoelectric module and a module compression means for holding said module in compression between said flat top surface of said pedestal and said heat sink element.

2. The device as in claim 1 and further comprising insulating wafers positioned on two sides of said at least one module and providing electrical insulation of said at least one module from said at least one pedestal and said at least one heat sink element.

3. The device as in claim 1 wherein heat transfer element is a bottom rigid portion of said pedestal.

4. The device as in claim 1 wherein said heat transfer element is comprised of a flexible metal clamped tightly against said pipe and said pedestal.

5. The device as in claim 4 wherein said flexible metal is a woven copper strap.

6. The device as in claim 1 wherein said at least one pedestal is a plurality of pedestals, wherein said at least one heat sink element is a plurality of heat sink elements and said at least one thermoelectric module is a plurality of thermoelectric modules.

7. The device as in claim 6 wherein said heat transfer element comprises a flexible metal part.

8. The device as in claim 6 wherein said heat transfer element of each of said plurality of pedestals comprises a flexible metal part.

9. The device as in claim 8 wherein said flexible metal part is comprised of thin copper sheet.

10. The device as in claim 1 wherein said module compression means includes a plurality of Bellville washers.

11. The device as in claim 1 wherein said heat sink element comprises a cast aluminum fin unit.

12. The device as in claim 7 wherein said heat sink element comprises a flexible metal sheet.

13. The device as in claim 1 wherein said pedestal is generally cylindrical with circular cross sections with a circular bottom surface.

14. The device as claim 1 wherein said pedestal is generally prismatic with rectangular cross sections and a rectangular bottom surface with a thin dimension and a long dimension.

15. The device as in claim 11 wherein said heat sink element is a finned aluminum element with thin cylindrical fins.

16. The device as in claim 1 wherein said system in electrical communication with and is providing electrical power to a radio frequency transmitter.

17. The device as in claim 16 wherein said device is also providing electrical power to a sensor.

18. The device as in claim 1 wherein said generator comprises at least one thermoelectric module comprised of thin film thermoelectric n-legs and p-legs.

19. The device as in claim 1 wherein said pipe is substantially hotter than ambient air surrounding the pipe.

20. The device as in claim 1 wherein said pipe is substantially colder than ambient air surrounding the pipe.

21. A quick attachable electric generator device for producing electric power from outside surface of a pipe, said device comprising:
   A) at least one heat conducting pedestal with flat top surface and a heat transfer element conforming to and in thermal communication with said outside surface, wherein said pedestal is generally cylindrical with circular cross sections and a circular bottom surface,
   B) at least one clamping means to hold said heat transfer element in compression against said outside surface, wherein said clamping means is a plurality of magnets positioned around said pedestal in bottomless cups,
   C) at least one heat sink element, and
   D) at least one thermoelectric module and a module compression means for holding said module in compression between said flat top surface of said pedestal and said heat sink element.

22. A quick attachable electric generator device for producing electric power from outside surface of a pipe, said device comprising:
   A) at least one heat conducting pedestal with flat top surface and a heat transfer element conforming to and in thermal communication with said outside surface, wherein said pedestal is generally prismatic with rectangular cross sections and a rectangular bottom surface with a thin dimension and a long dimension,
   B) at least one clamping means to hold said heat transfer element in compression against said outside surface, wherein said clamping means is a plurality of magnets positioned around said pedestal in bottomless cups,
   C) at least one heat sink element, and
   D) at least one thermoelectric module and a module compression means for holding said module in compression between said flat top surface of said pedestal and said heat sink element.

\* \* \* \* \*